US009284935B2

(12) United States Patent
Kamachi (10) Patent No.: US 9,284,935 B2
(45) Date of Patent: Mar. 15, 2016

(54) WARM-UP APPARATUS FOR VEHICLE (71) Applicant: MITSUBISHI JIDOSHA KOGYO KABUSHIKI KAISHA, Tokyo (JP)

(72) Inventor: Makoto Kamachi, Okazaki (JP)

(73) Assignee: MITSUBISHI JIDOSHA KOGYO KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/341,911

(22) Filed: Jul. 28, 2014

(65) Prior Publication Data
US 2015/0028019 A1    Jan. 29, 2015

(30) Foreign Application Priority Data

Jul. 29, 2013  (JP) .................................. 2013-156491

(51) Int. Cl.
*H05B 1/02* (2006.01)
*F02N 19/02* (2010.01)
*G01R 19/00* (2006.01)
(Continued)

(52) U.S. Cl.
CPC .............. *F02N 19/02* (2013.01); *B60H 1/2218* (2013.01); *B60L 1/04* (2013.01); *B60L 1/06* (2013.01); *B60L 1/08* (2013.01); *G01R 19/0084* (2013.01); *G01R 19/0092* (2013.01); *H05B 1/0236* (2013.01); *B60H 2001/2234* (2013.01); *B60H 2001/2265* (2013.01)

(58) Field of Classification Search
CPC .... F02N 19/02; H05B 1/0236; H05B 3/0042; G01R 19/0084; G01R 19/0092; B60L 1/04; B60L 1/06; B60L 1/08; B60H 1/2218; B60H 2001/2234; B60H 2001/2265

USPC ......... 219/483, 485, 486, 202, 203, 205, 206, 219/495, 505, 497
See application file for complete search history.

(56) References Cited

U.S. PATENT DOCUMENTS 5,281,792 A * 1/1994 Lee et al. ....................... 219/209
5,656,916 A * 8/1997 Hotta ............................ 320/160
(Continued)

FOREIGN PATENT DOCUMENTS

DE    10 2010 000 267 A1    8/2011
EP    2 522 534 A1    11/2012
(Continued)

OTHER PUBLICATIONS

Extended European Search Report issued Dec. 16, 2014 in corresponding European Patent Application No. EP 14 17 8717.
(Continued)

*Primary Examiner* — Mark Paschall
(74) *Attorney, Agent, or Firm* — Birch, Stewart, Kolasch & Birch, LLP (57) ABSTRACT A warm-up apparatus for a vehicle including a system which charges a battery by using an external power supply is provided. The warm-up apparatus includes a heater for warming up, a current detector, a voltage detector and a resistance changer. The heater is mounted in the vehicle and produces heat by receiving electric power from the external power supply. The current detector detects an allowable current value of the external power supply. The voltage detector detects an output voltage value of the external power supply. The resistance changer changes an electric resistance value of the heater based on the allowable current value detected by the current detector and the output voltage value detected by the voltage detector.

6 Claims, 4 Drawing Sheets (51) Int. Cl.
    *B60L 1/04*     (2006.01)
    *B60L 1/06*     (2006.01)
    *B60L 1/08*     (2006.01)
    *B60H 1/22*     (2006.01)

(56) References Cited

U.S. PATENT DOCUMENTS

| | | | | |
|---|---|---|---|---|
| 6,911,627 | B2* | 6/2005 | Oguma et al. | 219/483 |
| 8,334,483 | B2* | 12/2012 | Jaccard et al. | 219/442 |
| 8,859,940 | B2* | 10/2014 | Shimura | 219/216 |
| 2004/0219409 | A1* | 11/2004 | Isogai | 429/26 |
| 2010/0280698 | A1* | 11/2010 | Ichikawa | 701/22 |
| 2012/0025773 | A1* | 2/2012 | Wang et al. | 320/129 |
| 2012/0318783 | A1 | 12/2012 | Kamachi | |

FOREIGN PATENT DOCUMENTS

| | | |
|---|---|---|
| GB | 924664 A | 5/1963 |
| JP | 2009-224256 A | 10/2009 |

OTHER PUBLICATIONS

Nov. 2, 2012—Retrieved from the Internet: de.wikipedia.org/wiki/Heizwiderstand.
Nov. 23, 2008-retrieved from the Internet: www.bartec.de/ProdCatalogue/Assets/Datasheets/1ng_0/E230940_1E.pdf, HSF Radiator, pp. 126-127.

* cited by examiner

WARM-UP APPARATUS FOR VEHICLE

BACKGROUND

The present invention relates to a warm-up apparatus for a vehicle incorporating a battery which can be charged by an external power supply.

A warm-up control using an electric heater is known as one of controls for improving the starting performance of a vehicle under an extremely low temperature environment. In a hybrid vehicle on which a gasoline engine or a diesel engine is mounted, an approach widely spreads in which an electric heater called an engine block heater is incorporated in an engine block so as to warm up the engine block directly to thereby improve the starting performance of the engine. Additionally, also in an electric vehicle in which no engine is mounted, the performance of a battery decreases as the environmental temperature decreases. To cope with this, it is proposed that the temperature of the battery is raised (that is, the battery is warmed up) by using a battery heater mounted on the periphery or in an interior of the battery (for example, refer to Patent Document 1).

Incidentally, in the electric vehicle and the hybrid vehicle which are described above, the electric heater can be actuated by using electric power of a drive battery. On the other hand, when the drive battery is charged external by making use of household electric power available at midnight in the vehicle owner's household, the electric heater can also be actuated by making use of the external electric power when the vehicle is started in the following morning. Thus, it is considered that the electric power stored in the drive battery is saved by such a control to eventually extend a mileage to be covered by the vehicle.

[Patent Document 1] JP-A-2009-224256

SUMMARY

The invention has been made in view of the problem, and an object thereof is to provide a warm-up apparatus which can execute a warm-up control appropriately without depending upon the specification of a charging facility. In addition to this object, it can also be regarded as the other object of the invention to provide working effects which are produced by configurations described in a mode for carrying out the invention which will be described later and which cannot be provided by the prior art.

(1) According to an advantageous aspect of the invention, there is provided a warm-up apparatus for a vehicle including a system which charges a battery by using an external power supply, the warm-up apparatus comprising:

a heater for warming up, mounted in the vehicle, and configured to produce heat by receiving electric power from the external power supply;

a current detector configured to detect an allowable current value of the external power supply;

a voltage detector configured to detect an output voltage value of the external power supply; and a resistance changer configured to change an electric resistance value of the heater based on the allowable current value detected by the current detector and the output voltage value detected by the voltage detector.

(2) The resistance changer may change the electric resistance value of the heater to a value which corresponds to a ratio of the output voltage value to the allowable current value.

(3) The warm-up apparatus may further comprise a pilot signal output unit, provided in a control box which is incorporated in a charging cable connecting the vehicle to the external power supply, and configured to output a pilot signal of a duty ratio which corresponds to the allowable current value. The current detector may detect the allowable current value based on the duty ratio of the pilot signal which is output from the pilot signal output unit.

(4) The heater may include a plurality of resistors whose electric resistances differ from each other and a plurality of switches.

(5) The heater may include a variable resistor in which an electric resistance thereof can be changed.

DETAILED DESCRIPTION OF EXEMPLIFIED EMBODIMENTS

The specification of external charging differs largely depending upon charging equipment. For example, in the specification of charging equipment which is connected to household power supply equipment in Japan, a single-phase, alternating current 100V power supply system and a single-phase, alternating current 200V power supply system are used in a mixed fashion. The magnitude of an allowable current which can be taken out from the charging equipment also differs depending upon the power supply systems or contract current values of household power supply equipment.

Because of this, when the electric heater is actuated by making use of electric power supplied external without consideration of the specification of the external power supply equipment, an excessive electric load acts on the external charger, leading to fears that a breaker in the household power supply equipment is activated. Alternatively, when the load of the electric heater is too small in relation to the power supply capacity of the external charger, the time spent until the vehicle is warmed up becomes long, calling for a reduction in warming up efficiency or starting performance of the vehicle. In particular, in the case of vehicles which are sold outside Japan, there is a case where charging standards differ by regions of destinations where vehicles are sold, which makes the aforesaid problem remarkable, and it becomes difficult to make efficient use of electric power supplied from the external power supply.

According to an embodiment of the invention, a vehicle warm-up apparatus is provided which can execute a warm-up control as required without depending upon the specification of charging equipment.

Referring to the figures, a vehicle warm-up apparatus as an embodiment of the invention will be described. It is noted that the following embodiment only describes an example and that there is no intention to exclude various modifications or applications of techniques which are not described in the following embodiment. Individual configurations of this embodiment can be modified variously without departing from the spirit and scope of each of the configurations. Additionally, the configurations can selectively be adopted or omitted to carry out the invention. Further, the configurations can be combined together as required.

1. Apparatus Configuration

Figure 1:
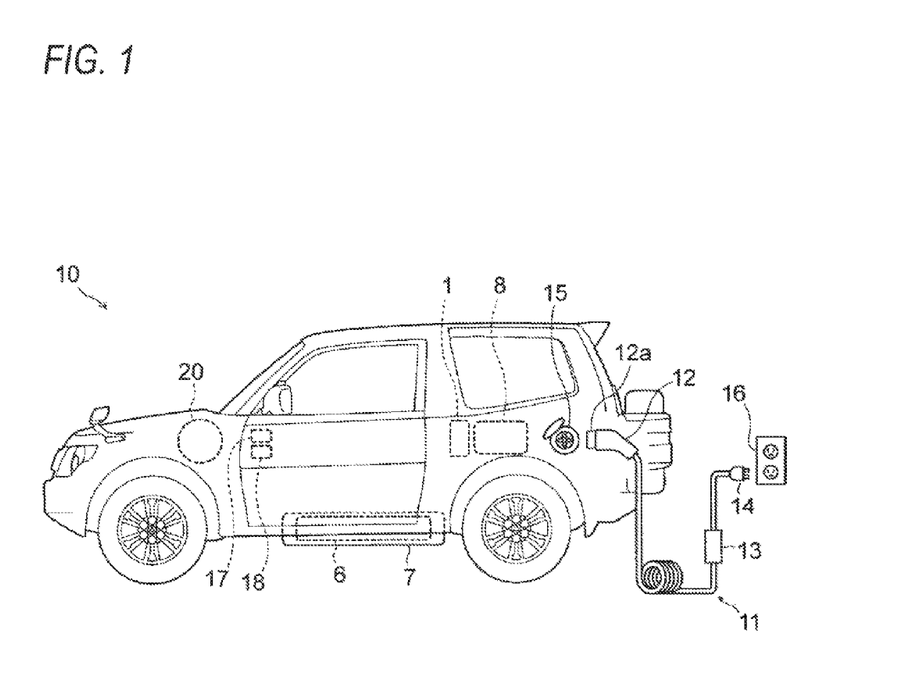
FIG. 1 is a side view showing exemplarily the configuration of a vehicle to which a warm-up apparatus according to an embodiment is applied.

A vehicle warm-up apparatus of this embodiment is a warm-up apparatus for a vehicle 10 shown in FIG. 1 which includes a system in which a vehicle driving battery 6 is charged by an external power supply. This vehicle 10 is an electric vehicle or a hybrid vehicle in which a motor 20 (a vehicle drive motor) is driven by electric power stored in the battery 6. The motor 20 is an electric generator which functions as a generator as well as an electric motor. Additionally, the battery 6 is a battery device which is charged by electric power which is supplied from the external power supply or electric power regenerated by the motor 20 and is mounted in the vehicle 10 as a power supply for the motor 20. The external power supply is charging equipment which is provided outside the vehicle 10 and includes, for example, household charging equipment or public charging equipment.

An inlet 15 (an electric power take-in port) is provided in an external surface of a side of the vehicle 10 for connection of a charge cable 11 when the battery 6 is charged by an external power supply. Additionally, an on-board charger 8 is provided on a charge circuit which connects the inlet 15 with the battery 6. The on-board charger 8 is an electric power transformer device which transforms an alternating current which is supplied from the external power supply to a direct current to charge the battery 6. For example, an alternating current which is inputted from the external power supply is converted to a direct current in the on-board charger 8 to be fed to the battery 6. The operation of the on-board charger 8 is controlled by an on-board controller 1 which is mounted in the vehicle 10.

Here, the following three types of specifications are presumed as the specification of the external power supply. Rated voltages of household plug sockets used worldwide are a single-phase alternating current power supply of 100 to 240 [V] and a three-phase alternating current power supply of 200 to 400[V].

TABLE 1

|  | Type A | Type B | Type C |
| --- | --- | --- | --- |
| Voltage Value [V] | 120 | 240 | 240 |
| Current Value [A] | 8 | 8 | 16 |

A heater 7 is provided in the vicinity of the battery 6. This heater 7 is a heating device which generates heat for warming up the vehicle 10 by using a current supplied from the battery 6 or a current supplied from the external power supply. When used herein, the heat for warming up means generally heat for warming up a power plant (a power device) when the vehicle is cold started and is used to raise the temperature of the battery 6 or the drive motor 20. Additionally, in the case of the vehicle 10 being a hybrid vehicle which includes an engine in addition to an electric motor, the heat of the heater 7 is used to warm up an engine main body or engine oil, an engine coolant, and other on-board devices. In this embodiment, the heater 7 is mainly used to raise the temperature of the battery 6 after the battery 6 is charged by the external power supply. The warm-up control for raising the temperature of the battery 6 may be executed before charging or during charging the battery 6 as well as after charging the battery 6.

In addition, as shown in FIG. 1, a charge gun 12 is provided at one end of the charge cable 11, and a connector 12a is provided at a distal end of the charge gun 12 for connection with the inlet 15 of the vehicle. A plug 14 is provided at the other end of the charge cable 11 for connection with a plug socket 16 of a household charging equipment or a public charging equipment. This plug socket 16 is connected to an external power supply (for example, a commercial power supply or a non-utility generation power supply) via an electric wiring, not shown.

Figure 2:
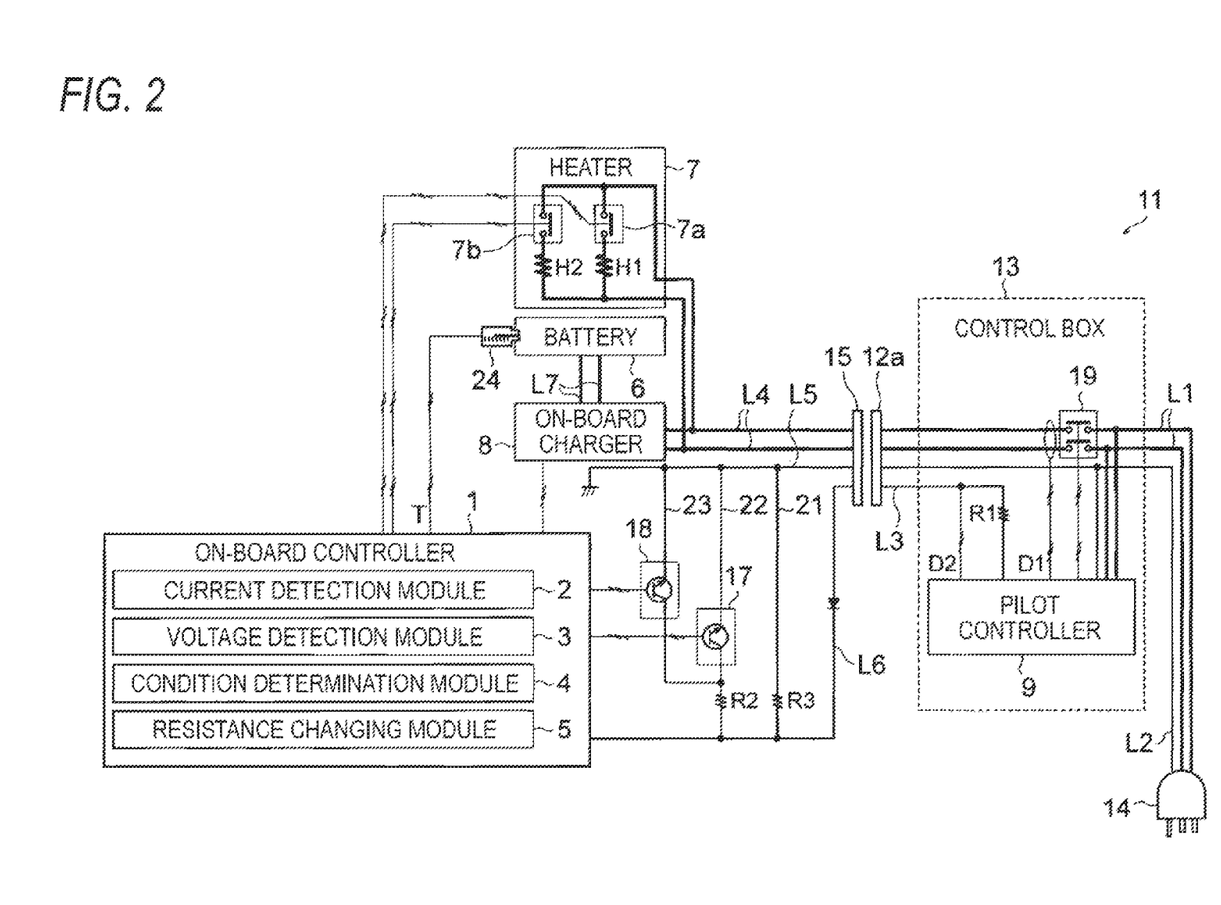
FIG. 2 is a circuit diagram showing schematically a block configuration and circuit of the warm-up apparatus in FIG. 1.

A control box 13, which incorporates a pilot controller 9 (a pilot signal output unit) and a relay 19, is installed in a halfway position along the length of an electric power supply line between the plug 14 and the charge gun 12 of the charge cable 11, as shown in FIG. 2. The relay 19 is a relay which is controlled to be connected or disconnected by the pilot controller 9 and functions to switch the circuit between a closed state where a current supplied from the external power is supplied to the vehicle 10 and an open state where the supply of the current is cut off. The pilot controller 9 controls the relay 19 to be connected or disconnected and outputs pilot signals which convey various pieces of information on the feeding state by the external power supply and the magnitude of an allowable current (or a rated current) of the external power supply to the vehicle 10. The general function of the pilot controller 9 should conform to a national standard or industrial standard of a destination where the vehicle 10 is sold or an international standard.

As shown in FIG. 1, a charge permission switch 17 and a warm-up heater switch 18 are provided in arbitrary positions within a passenger compartment. The charge permission switch 17 is a switch which is switched on when the battery 6 is charged by the external power supply and which is switched off at any other time than the time when the battery 6 is so charged. Switching on the charge permission switch 17 is a required condition for execution of the external charging. The warm-up heater switch 18 is a switch which is switched on when the vehicle 10 is warmed up and which is switched off when the vehicle 10 is not warmed up. Switching on the warm-up heater switch 18 is a required condition for execution of the warm-up control.

These charge permission switch 17 and warm-up heater switch 18 may be switched on or off manually by the user or be switched on or off automatically by the on-board controller 1 according to predetermined control conditions. In this embodiment, the charge permission switch 17 and the warm-up heater switch 18 are adopted which can not only be switched on or off manually but also be switched on or off automatically by the on-board controller 1 when the predetermined control conditions are met.

A temperature sensor 24 is provided in an interior of the battery 6 to detect the temperature of battery cells incorporated in the battery 6 or an interior temperature of a battery case as a battery temperature T. Information on the battery temperature T detected here is transmitted to the on-board controller 1.

2. Circuit Configuration

[2-1. Configuration on Cable Side]

As shown in FIG. 2, two power supply wires L1 and an earth wire L2 which is earthed are laid out between the plug 14 and the control box 13 on the charge cable 11. On the other hand, a signal wire L3 is laid out between the control box 13 to the connector 12a of the charge gun 12 in addition to the power supply wires L1 and the earth wire L2. This signal wire L3 is a line (a signal line) on which information is communicated between the on-board controller 1 and the pilot controller 9.

The relay 19 within the control box 13 is installed in halfway positions on the individual power supply wires L1. The pilot controller 9 is connected to receiving wires which branch off the power supply wires L1 in positions which lie nearer to the plug 14 than the relay 19 and is actuated at the same time as the plug 14 is connected to the external power supply. Additionally, a leak voltage detection circuit D1 is provided within the pilot controller 9 to detect a leak from the power supply wires L1 between the relay 19 and the connector 12a.

The pilot controller 9 transmits a pilot signal which corresponds to the magnitude of a current (an allowable current, a rated current) which the external power supply can supply to the vehicle 10 via the signal wire L3. This pilot signal takes the form of a square wave of a duty ratio which corresponds to the magnitude of the allowable current of the external power supply. The magnitude of the allowable current of the external power supply differs according to a region to which the vehicle 10 is shipped. A target magnitude of an allowable current of an external power supply that will be available in a destination of the vehicle 10 is stored in advance in the pilot controller 9. A pilot signal output from the pilot controller 9 is transmitted to the on-board controller 1 of the vehicle 10. In the on-board controller 1 which receives the pilot signal, the magnitude of the allowable current of the external power supply is grasped based on the duty ratio of the pilot signal.

A resistance element R1 is installed in the signal wire L3, and a signal voltage detection line D2 is provided which branches off in a position which lies nearer to the connector 12a than the resistance element R1. The signal voltage detection line D2 detects a voltage between the resistance element R1 and the connector 12a and transmits the detected voltage to the pilot controller 9 as a signal voltage. This signal voltage detected by the signal voltage detection line D2 varies according to a resistance value of a signal wire L6 in the vehicle 10 which is connected to the signal wire L3. The pilot controller 9 identifies whether or not the connector 12a is connected or the switches in the vehicle 10 are operated.

[2-2. Configuration on Vehicle Side]

Power supply wires L4, an earth wire L5 and a signal wire L6 are also laid out in the vehicle 10 so as to correspond to the power supply wires L1, the earth wire L2 and the signal wire L3, respectively, across the connector 12a and the inlet 15. The heater 7 and the on-board charger 8 are connected parallel to the power supply wires L4 as shown in FIG. 2. Additionally, the battery 6 is connected to the on-board charger 8 via a charge wire L7. The magnitude of electric power which is supplied from the on-board charger 8 to charge the battery 6 and the magnitude of electric power which is converted to heat in the heater 7 are identified by the on-board controller 1.

A plurality of resistors H1, H2 having different electric resistances are provided in an interior of the heater 7, and switches 7a, 7b are also provided therein to control the energization of the individual resistors H1, H2. In FIG. 2, the heater 7 has the two resistors H1, H2 and the two switches 7a, 7b. In the following description, when the resistors H1, H2 and the switches 7a, 7b are described separately, they are prefixed (with a first and a second). The first resistor H1 and the second resistor H2 are both resistance heating members which are heated by being energized individually and are installed parallel to each other in relation to the power supply wires L4.

The magnitudes of the electric resistances of the resistors H1, H2 are set according to the specification of the external power supply. In this embodiment, the electric resistance of the first resistor H1 is 15[Ω], and the electric resistance of the second resistor H2 is 30[Ω]. Additionally, the first switch 7a is connected in series to the first resistor H1, and the second switch 7b is connected in series to the second resistor H2. Consequently, the first resistor H1 and the second resistor H2 are fed from the external power supply only when the corresponding switches 7a, 7b are on. The first switch 7a and the second switch 7b are controlled to be switched on or off by the on-board controller 1.

A rectifier is installed in the signal wire L6, and this rectifier permits only a current flowing from the inlet 15 towards the on-board controller 1 to flow. An opposite end portion of the signal wire L6 to an end portion facing the inlet 15 is connected to the on-board controller 1. This enables the on-board controller 1 to detect a pilot signal which is transmitted from the signal wire L3 to the pilot controller 9 and controls the heater 7 and the on-board charger 8 based on the pilot signal detected.

A plurality of resistance circuits 21 to 23 are provided to connect the earth wire L5 and the signal wire L6 as by steps of a ladder. These resistance circuits 21 to 23 are circuits by which the on-board controller 1 and the pilot controller 9 detect whether or not the connector 12a and the inlet 15 are connected, the charge permission switch 17 is operated and the warm-up heater switch 18 is operated. FIG. 2 shows exemplarily an electric circuit which installs two resistance elements R2, R3.

The resistance element R3 is installed in the first resistance circuit 21. When the connector 12a and the inlet 15 are connected, the signal wire L3 is closed via the earth wires L2, L5. This generates a predetermined voltage value which corresponds to divided resistance voltage values of the resistance elements R1, R3 in the signal voltage detection line D2.

The resistance element R2 and the charge permission switch 17 are installed in the second resistance circuit 22. When the charge permission switch 17 is on, a predetermined voltage is generated in the signal voltage detection line D2 which correspond to divided resistance voltage values of the resistance elements R1, R2, R3. The pilot controller 9 determines whether or not the charge permission switch 17 is on based on these signal voltages generated in the signal voltage detection line D2. The signal voltages are also transmitted to the on-board controller 1, and therefore, the on-board controller 1 can also determine whether or not the charge permission switch 17 is on.

The third resistance circuit 23 is a circuit which branches off the second resistance circuit 22 in a position between the resistance element R2 and the charge permission switch 17 and installs the warm-up heater switch 18 therein. When either of the charge permission switch 17 and the warm-up heater switch 18 is on, the predetermined voltage value which corresponds to the divided resistance voltage values of the resistance elements R1, R2, R3 is generated in the signal voltage detection line D2. The pilot controller 9 determines whether or not the charge permission switch 17 and the warm-up heater switch 18 are operated based on the signal voltage so generated in the signal voltage detection line D2.

In relation to the control of the relay 19 by the pilot controller 9, the operated states of the charge permission switch 17 and the warm-up heater switch 18 do not have to be identified separately. However, the operated states of the charge permission switch 17 and the warm-up heater switch 18 may be configured to be identified separately by making use of a detection circuit, not shown, for example. Similarly, the on-board controller 1 can also monitor individually the operated states of the charge permission switch 17 and the warm-up heater switch 18 by a detection circuit, not shown.

3. Control Configuration

[3-1. Summary]

The on-board controller 1 (the warm-up controller) and the pilot controller 9 are electronic devices in which for example, a microprocessor such as a CPU (Central Processing Unit), an MPU (Micro Processing Unit) or the like, a ROM (Read Only Memory), a RAM (Random Access Memory), an auxiliary storage unit, an interface unit and the like are integrated and govern the charge control and the warm-up control of the vehicle 10.

The on-board controller 1 is connected to a communication line of an on-board network which is provided in the vehicle 10. Various known electronic control units such as, for example, a motor control unit and an engine control unit, a brake control unit, a transmission control unit, an air-conditioner control unit, and an electrical equipment control unit are connected to the on-board network so as to communicate with each other. Information can be transmitted between the pilot controller 9 and the on-board controller 1 via at least the signal wires L3, L6. A communication bus of the on-board network, not shown, may be provided between the on-board controller 1 and the pilot controller 9.

Here, the functions of the on-board controller 1 and the pilot controller 9 will be described.

The pilot controller 9 has a function to connect or disconnect the relay 19 and a function to transmit the information on the allowable current of the external power supply to the on-board controller 1. As conditions for connection of the relay 19, for example, the vehicle 10 and the charge gun 12 are connected together, and the charge permission switch 17 is on. The pilot controller 9 connects the relay 19 when those predetermined conditions are met. Additionally, the pilot controller 9 generates a pilot signal of a duty ratio which corresponds to the magnitude of the allowable current of the external power supply and outputs this pilot signal to the signal wire L3.

The on-board controller 1 has a function to control the charging of the battery 6 by the external power supply and a function to control the warm-up after the completion of charging the battery 6 by the external power supply. As conditions for starting the control of the charging of the battery 6 by the external power supply, for example, the vehicle 10 is connected to the external power supply so as to be fed from the external power supply, and the charge permission switch 17 is on. The on-board controller 1 controls the warm-up of the vehicle 10 after the completion of controlling the charging of the battery 6 by the external power supply. In the case of the battery 6 having been charged full, the on-board controller 1 controls only the warm-up of the vehicle 10.

[3-2. Control Block]

As software or hardware for executing the warm-up control described above, the on-board controller 1 includes a current detection module 2, a voltage detection module 3, a condition determination module 4 and a resistance changing module 5. The contents of processings in the individual elements are recorded in the ROM, the RAM, the auxiliary storage unit, a removable medium or the like as an application program, for example. When the program is executed, the contents of the program are deployed in a memory space of the ROM, RAM so as to be executed by the microprocessor.

The current detection module 2 (a current detector) detects an allowable current value I[A] of the external power supply based on the duty ratio of the pilot signal transmitted from the pilot controller 9 via the signal wire L6. The allowable current value I of the external power supply means a largest current value (a current value constituting a condition for a proper operation of the charge system) that can be taken out from the external power supply and corresponds to a rated current value of the external power supply. In general, a rated current value is determined based on a predetermined industrial standard or national standard, an international standard or the like. However, an allowable current value I of a magnitude which differs from the rated current value (smaller than the rated current value) may be set to enhance the protection of the power supply equipment or the charge cable 11.

The setting of the allowable current value I may be corrected according to the battery temperature T. For example, when the battery temperature T is equal to or higher than a predetermined temperature $T_1$ (the predetermined temperature $T_1$ should be a smaller value than a predetermined temperature $T_0$ which will be described later), the allowable current value I may be set lower. In other words, the allowable current value I may be set lower as the battery temperature T increases higher. By setting the allowable current value I in this way, the output of the heater 7 can be reduced when the necessity of warming up the battery 6 is relatively small with the starting conditions of the warm-up control met.

When the specification of the external power supply is the type A or the type B described above, an allowable current value I to be detected here is 8[A]. Additionally, when the specification of the external power supply is the type C above, an allowable current value I to be detected here is 16[A]. Information on the allowable current value I detected here is transmitted to the resistance changing module 5.

The voltage detection module 3 detects an output voltage value V[V] of the external power supply. Here, an effective value (a normal voltage) of an alternating current voltage that is actually supplied to the power supply wires L4 of the vehicle 10 is obtained. When the specification of the external power supply is the type A above, an output voltage value V to be detected here is 120[V]. Additionally, when the specification of the external power supply is the type B or the type C above, an output voltage value V to be detected here is 240[V]. Information on the output voltage value V detected here is transmitted to the resistance changing module 5. A configuration may be adopted in which in place of the actually measured voltage value, the rated voltage value of the external power supply is detected as an output voltage value V.

Namely, the "output voltage value" is set based on, for example, the predetermined industrial standard or national standard, the international standards or the like and corresponds to the rated voltage value of the external power supply. Alternatively, the actually measured value of the voltage that is supplied from the external power supply may be used as the "output voltage value."

The condition determination module 4 determines a starting condition and an ending condition of the warm-up control by the external power supply. Here, the condition determination module 4 also determines whether or not the warm-up control should be executed. When the charge control is executed, after the charge control ends, it is determined whether or not the warm-up control should be executed. Additionally, it is determined whether or not the warm-up control should end during the warm-up control.

As the starting condition of the warm-up control, for example, the warm-up heater switch 18 is on, the charge control has ended, the battery temperature T is less than the predetermined temperature $T_0$, and the like. In the condition determination module 4 of this embodiment, it is determined that the starting condition of the warm-up control is met in the event that the warm-up heater switch 18 is on. However, even though the warm-up heater switch 18 is on, in the event that the charge permission switch 17 is also on, the warm-up control is executed after the completion of the charge control.

Additionally, as the ending condition of the warm-up control, for example, the battery temperature T reaches the predetermined temperature $T_0$ or higher, the period of time when the warm-up control continues reaches a predetermined period of time or longer, the warm-up heater switch 18 is switched off manually, or the like. In the condition determination module 4 of this embodiment, it is determined that the ending condition of the warm-up control is met at a point in time when the battery temperature T reaches the predetermined temperature $T_0$ or higher. The result determined here is transmitted to the resistance changing module 5.

The resistance changing module 5 (a resistance changer) changes the electric resistance value R[Ω] of the heater 7 is changed according to the specification of power supply from the external power supply. Here, the electric resistance value R of the heater 7 is controlled based on the allowable current value I detected by the current detection module 2 and the output voltage value V detected by the voltage detection module 3. The electric resistance R that is controlled here is to have a magnitude which corresponds to a value of a ratio of the output voltage value V to the allowable current value I.

For example, when the specification of the external power supply is the type A (the current value is 8[A], the voltage value is 120[V]) above, the electric resistance value R of the electric heater 7 is 15[Ω]. Namely, the electric resistance value R of the electric heater 7 is set so as to coincide with a value of a ratio (120/8=15) of the voltage value of 120[V] to the current value 8[A]. As this occurs, only the first switch 7a of the heater 7 is controlled to be on, whereby only the first resistor H1 is energized.

On the other hand, when the specification of the external power supply is the type B (the current value is 8[A], the voltage value is 240[V]) above, the electric resistance value R of the electric heater 7 is 30[Ω]. Namely, only the second switch 7b is controlled to be on, whereby only the second resistor H2 is energized. When the specification of the external power supply is the type C (the current value is 16[A], the voltage value is 240[V]) above, as with the case where the specification of the external power supply is the type A, the electric resistance value R of the electric heater 7 is 15[Ω]. Namely, only the first switch 7a of the heater 7 is controlled to be on, whereby only the first resistor H1 is energized.

When the condition determination module 4 determines that the ending condition of the warm-up control is met, the resistance changing module 5 controls both the switches 7a, 7b to be off, whereby the energization of the heater 7 is cut off, and the warm-up control ends.

4. Flowchart

[4-1. Pilot Controller]

Figure 3:
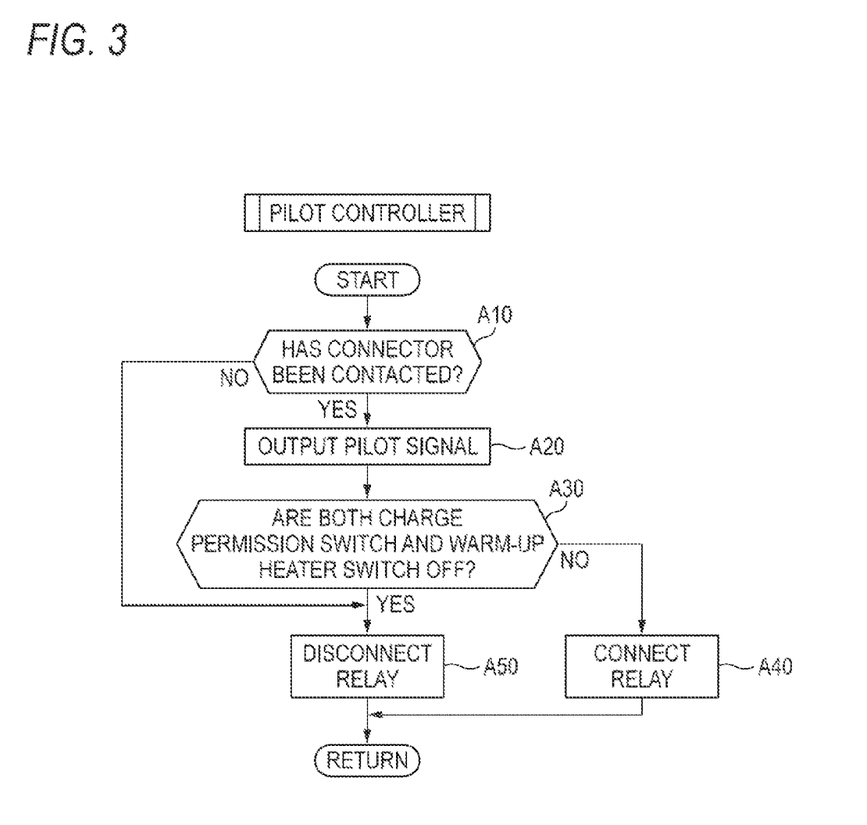
FIG. 3 is a flowchart showing exemplarily the details of a control executed by a pilot controller according the embodiment shown in FIG. 1.

FIG. 3 is a flowchart showing a procedure of a control that is executed by the pilot controller 9. The pilot controller 9 is energized when the plug 14 is connected to the plug socket 16 of the external power supply and controls repeatedly the connection or disconnection of the relay 19 and the output of the pilot signal at a predetermined cycle (for example, a cycle of several [ms]).

In step A10, it is determined whether or not the connector 12a of the charge gun 12 is connected to the inlet 15 of the vehicle 10. Here, whether or not the connector 12a is connected to the vehicle 10 is determined based on the magnitude of the signal voltage that is transmitted from the signal voltage detection line D2. Then, the control procedure proceeds to step A20 if the connector 12a is connected to the inlet 15, while if not, the control procedure proceeds to step A50.

In step A20, a pilot signal having a duty ratio which corresponds to the magnitude of the allowable current of the external power supply is generated in the pilot controller 9, and the pilot signal so generated is output to the signal wire L3. The magnitude of the duty ratio is set to such a magnitude corresponding to, for example, the actual value of the alternating current. This pilot signal is transmitted to the on-board controller 1 from the signal wire L3 at all times while electric power is supplied from the external power supply.

In the following step A30, it is determined whether or not both the charge permission switch 17 and the warm-up heater switch 18 in the vehicle 10 are off. Whether or not these switches 17, 18 are operated is determined based on the magnitude of the signal voltage that is transmitted from the signal voltage detection line D2. Here, if both the charge permission switch 17 and the warm-up heater switch 18 are off, the control procedure proceeds to step A50, while if at least either of the switches is on, the control procedure proceeds to step A40.

In step A40, a control signal is output from the pilot controller 9 to the relay 19, whereby the relay 19 is controlled to be connected. This enables the electric power of the external power supply to be supplied to the heater 7 and the on-board charger 8 via the power supply wires L1, L4.

On the other hand, if the control procedure proceeds to step A50, a control signal which is different from the control signal output when the control procedure proceeds to step A30 is output to the relay 19 from the pilot controller 9, and the relay 19 is controlled to be disconnected. This cuts off the power supply from the plug socket 16. Consequently, for example, in the event that the connector 12a is disconnected while the electric power is being supplied from the external power supply, or in the event that both the charge permission switch 17 and the warm-up heater switch 18 are operated to be off, the power supply from the relay 19 to the connector 12a is also stopped.

[4-2. On-Board Controller]

Figure 4:
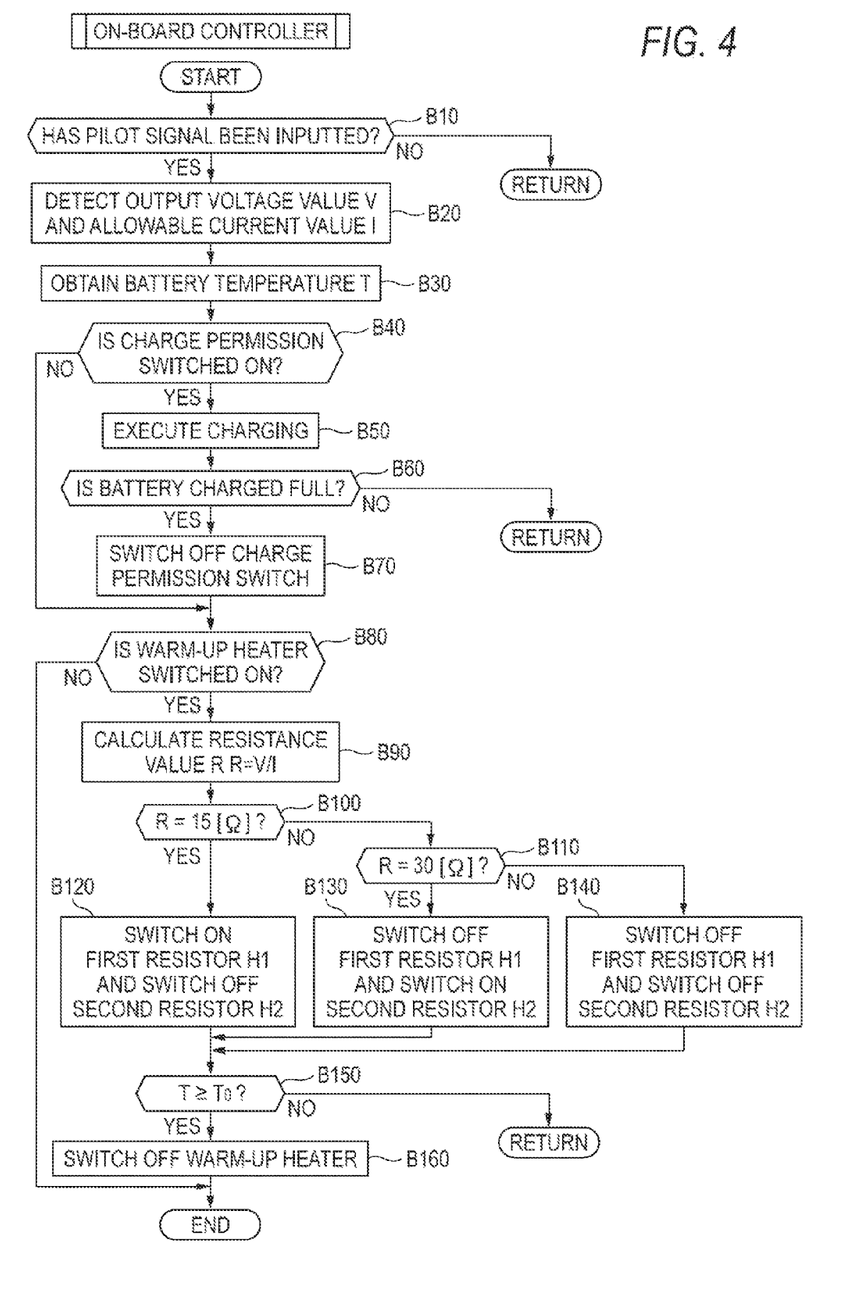
FIG. 4 is a flowchart showing exemplarily the details of a control executed by an on-board controller according to the embodiment shown in FIG. 1.

FIG. 4 is a flowchart showing a procedure of a control that is executed by the on-board controller 1. The on-board controller 1 is energized by being supplied with electric power from an on-board battery, not shown and controls repeatedly the operation of the heater 7 and the operation of the on-board charger 8 at a predetermined cycle (for example, a cycle of several [ms]).

In step B10, it is determined whether or not the pilot signal output from the pilot controller 9 is inputted into the on-board controller 1. Here, if the pilot signal is inputted into the on-board controller 1 via the signal line L6, the control procedure proceeds to step B20. On the other hand, if the pilot signal is not inputted into the on-board controller 1, the control in this arithmetic operation cycle ends, and a control is executed again from step B10 at the following arithmetic operation cycle.

In step B20, an allowable current value I of the external power supply is detected based on the duty ratio of the pilot signal in the current detection module 2, and in the voltage detection module 3, a voltage value of the power supply wires 4 is detected as the output voltage value V. Additionally, in the following step B30, information on the battery temperature T detected by the temperature sensor 24 is inputted into the on-board controller 1. The information of the battery temperature T obtained here is used to determine on the ending condition of the warm-up control. Additionally, the allowable current value I may be corrected based on the battery temperature T in the current detection module 2.

In step B40, it is determined whether or not the charge permission switch 17 is on. Here, if it is determined that the charge permission switch 17 is on, the control procedure proceeds to step B50, where the battery 6 is charged by the external power supply. On the other hand, if it is determined that the charge permission switch 17 is off, the control procedure proceeds to step B80 by skipping steps B50 to B70 in relation to the charge control.

In step B60, it is determined whether or not the battery 6 is charged full. Here, the ending condition of the charge control is determined. If it is determined that the battery 6 is not charged full, the control in this arithmetic operation cycle ends, the operation in step B10 is executed again in the following arithmetic operation cycle. In this case, the charge control by the external power supply continues until the battery 6 is charged full. On the other hand, if it is determined in step B60 that the battery 6 is charged full, the control procedure proceeds to step B70.

In step B70, the charge permission switch 17 is controlled automatically to be off by the on-board controller 1. In step B80, it is determined whether or not the starting condition of the warm-up control is met. For example, it is determined whether or not the warm-up heater switch 18 is on. If it is determined here that the warm-up heater switch 18 is on, the control procedure proceeds to step B90. On the other hand, if it is determined that the warm-up heater switch 18 is off, the flow ends. In this case, since both the charge permission switch 17 and the warm-up heater switch 18 are off, the relay 19 is controlled to be disconnected by the pilot controller 9.

In step B90, an electric resistance value R is calculated based on the output voltage value V and the allowable current value I of the external power supply in the resistance changing module 5. Here, a value of a ratio (V/I) of the output voltage value V to the allowable current value I is calculated as an electric resistance value R. For example, when the combination of the output voltage value V and the allowable current value I of the external power supply is 120[V], 8[A](the type A), an electric resistance value R calculated here is 15[Ω]. Additionally, an electric resistance value R when the specification of the external power supply is 240[V], 8[A](the type B) is 30[Ω], and an electric resistance value R when the specification of the external power supply is 240[V], 16[A] (the type C) is 15[Ω].

In step B100, it is determined whether or not the electric resistance value R calculated in the previous step is 15[Ω]. For example, when the specification of the external power supply is the type A or the type C described above, the electric resistance value R is 15[Ω], and since the condition is met, the control procedure proceeds to step B120. In step B120, the first switch 7a of the heater 7 is controlled to on, and the second switch 7b of the heater 7 is controlled to be off. Namely, the energized state of the heater 7 is controlled so that the resistance value of the resistance heating member of the heater 7 corresponds to the value (V/I) of the ratio of the output voltage value V to the allowable current value I. This allows only the first resistor H1 to be energized.

On the other hand, if the determination condition is not met in step B100, the control procedure proceeds to step B110. In B110, it is determined whether or not the electric resistance value R is 30[Ω]. For example, when the specification of the external power supply is the type B above, the electric resistance value is 30[Ω], and the determination condition is met. Therefore, the control procedure proceeds to step B130. In step B130, the first switch 7a is controlled to off and the second switch 7b is controlled to be on. Namely, in this case, too, the energized state of the heater 7 is controlled so that the resistance value of the resistance heating member of the heater 7 corresponds to the ratio of the output voltage value V to the allowable current value I. This allows only the second resistor H2 to be energized.

If the conditions are not met in steps B100, B110, the control procedure proceeds to step B140, where both switches 7a, 7b are controlled to be off, and the warm-up control is not executed. In step B150 which is executed after steps B120, B130, B140, it is determined whether or not the warm-up control ending condition is met. For example, it is determined whether or not the battery temperature T reaches the predetermined temperature $T_0$ or higher. The control is restarted from B10 in the following arithmetic operation cycle until the condition in relation to the battery temperature T is met.

If the warm-up control ending condition is met, the control procedure proceeds to step B160, where the warm-up heater switch 18 is controlled automatically to be off by the on-board controller 1. As this occurs, the relay 19 is disconnected in the pilot controller 9, and the power supply from the external power supply is cut off, and the warm-up control ends completely.

5. Function and Working Effect (1) In the warm-up apparatus described above, the electric resistance value R of the heater 7 is changed based on the allowable current I detected in the current detection module 2 and the output voltage value V of the external power supply detected in the voltage detection module 3. For example, when the specifications of the current and the voltage of the external power supply are those of the type A, the electric resistance value R of the heater 7 is set to 15[Ω]. On the other hand, when the external power supply of the type B is connected, the electric resistance value R of the heater 7 is changed automatically to 30[Ω]. In this way, the electric resistance value suitable for all the specification of the external power supply can be set. Consequently, the warm-up control can be suitably executed as required without depending upon the specification of the charge equipment.

(2) In the warm-up apparatus, the electric resistance value R of the heater 7 is set to the value which corresponds to the ratio (V/I) of the output voltage value to the allowable current I. By adopting this control configuration, the value of the current with which the heater 7 is energized can be made to coincide with the allowable current value I, whereby the warm-up can be executed efficiently by making full use of the feeding capability of the external power supply. Additionally, since there is no such situation that an excessively large magnitude of current which exceeds the allowable current value I is taken out from the external power supply (that an excessively large magnitude of current flows to the heater 7), there is no fear of the breaker of the external power supply being actuated, and the heater 7 is allowed to continue to operate as required.

(3) In the warm-up apparatus above, the allowable current value I of the external power supply is detected based on the duty ratio of the pilot signal that is output from the pilot controller 9. On the other hand, in the existing charge systems, there is developed a charge system in which the information on a rated current of an external power supply is transmitted to an on-board controller 1 as a duty ratio of a pilot signal when a battery 6 is charged by the external power supply. By executing the warm-up control by making use of the charge controlling pilot signal described above, the heater 7 can be actuated to operate as required without adding any change to the existing charge system or the communication standard.

(4) The plurality of resistors H1, H2 are provided in the heater 7, and the switches 7a, 7b are provided to control the energization of the individual resistors H1, H2. The switches 7a, 7b are controlled to be connected or disconnected by the on-board controller 1. Not only can the cost of the charge apparatus be reduced but also the warm-up can be executed as required by adopting the simple apparatus configuration. Additionally, when resistors H1, H2 are replaced to meet the standards of the destination of the vehicle 10, the replacement of resistors H1, H2 can advantageously be facilitated.

(5) In the warm-up apparatus described above, as shown in FIG. 4, when the charge permission switch 17 is operated to be on, the charge control takes priority over the warm-up control. The warm-up control is executed after the battery 6 is charged full. Consequently, the battery 6 can be charged full in an ensured fashion.

6. Modified Example

The invention is not limited to the embodiment that has been described heretofore and hence can be modified variously without departing from the spirit and scope thereof. The individual configurations of the invention can selectively be adopted or omitted as required or may be combined together as required.

In the embodiment, the heater 7 is described as incorporating the plurality of resistors H1, H2 and the plurality of switches 7a, 7b. However, a variable resistor (a digital potentiometer) may instead be used to change the electric resistance value R of the heater 7. Namely, the electric resistance value R of the variable resistor may be changed based on the output voltage value V and the allowable current value I of the external power supply.

As this occurs, similar to the embodiment described above, it is considered that the electric resistance value R of the variable resistor is set to a magnitude which corresponds to the ratio (V/I) of the output voltage value V to the allowable current value I. By adopting this control configuration, the same function and working effect as those of the embodiment described above can be provided. Additionally, external power supplies of various specifications can be dealt with by the single variable resistor, whereby the cost of the warm-up apparatus can be reduced further.

Further, by using the variable resistor, it is possible to set electric resistance values R appropriate to external power supplies which have specifications which are slightly difference from the type A to the type C described in the embodiment above. For example, when the external power supply is deteriorated slightly and the output voltage thereof is slightly lower than the rated voltage, the electric resistance value R of the heater 7 is set smaller according to the output voltage. Namely, the heat value of the heater 7 is reduced, and the electrical load of the heater 7 in relation to the external power supply is mitigated. Consequently, it is possible to prevent an excessively large magnitude of current from being taken out from the external power supply (the operation of the breaker), whereby the heater 7 can be operated appropriately.

The heater 7 may have both the plurality of resistors H1, H2 and the variable resistor.

In the embodiment, the electric vehicle or the hybrid vehicle is described as including the heater 7 which raises the temperature of the battery 6. However, the supply of heat generated in the heater 7 is not limited to the battery 6. For example, the heat of the heater 7 may be used to warm up the engine main body which is mounted in the hybrid vehicle or the engine oil, the engine coolant or other on-board devices. Alternatively, the heat of the heater 7 may be used to warm up the drive motor 20. By warming up at least the power plant (the power system) when the vehicle 10 is cold started, the starting performance of the vehicle 10 can be enhanced.

In addition, in the embodiment, the flowchart is shown which describes the configuration in which the charge control takes priority over the warm-up control. However, the warm-up control may take priority over the charge control, or both the controls may be executed simultaneously. The same function and working effect as those described in the embodiment are provided by changing at least the electric resistance value R of the heater 7 when the warm-up control is executed.

Thus, according to the warm-up apparatus of the invention, by changing the electric resistance value of the heater based on the output voltage value and the allowable current value of the external power supply, the heater can be operated appropriately to any equipment specifications to thereby enhance the starting performance of the vehicle.

What is claimed is:

1. A warm-up apparatus for a vehicle including a system which charges a battery by using an external power supply, the warm-up apparatus comprising:
    a heater for warming up, mounted in the vehicle, and configured to produce heat by receiving electric power from the external power supply;
    a current detector configured to determine an allowable current value that can be supplied to the vehicle by the external power supply and differs depending upon a specification of a charging equipment, based on a stored value which is stored in advance;
    a voltage detector configured to detect an output voltage value of the external power supply; and
    a resistance changer configured to change an electric resistance value of the heater based on the allowable current value detected by the current detector and the output voltage value detected by the voltage detector.

2. The warm-up apparatus according to the claim 1, wherein
    the resistance changer changes the electric resistance value of the heater to a value which corresponds to a ratio of the output voltage value to the allowable current value.

3. The warm-up apparatus according to the claim 1, further comprising:
    a pilot signal output unit, provided in a control box which is incorporated in a charging cable connecting the vehicle to the external power supply, and configured to output a pilot signal of a duty ratio which corresponds to the allowable current value,
    wherein the current detector receives the pilot signal which is output from the pilot signal, and detects the allowable current value based on the duty ratio of the pilot signal.

4. The warm-up apparatus according to the claim 1, wherein
    the heater includes a plurality of resistors whose electric resistances differ from each other and a plurality of switches.

5. The warm-up apparatus according to the claim 1, wherein
    the heater includes a variable resistor in which an electric resistance thereof can be changed.

6. The warm-up apparatus according to the claim 1, wherein
    the allowable current value is smaller than a rated current value of the external power supply.

* * * * *